(12) United States Patent
Fiacco et al.

(10) Patent No.: US 8,268,740 B2
(45) Date of Patent: Sep. 18, 2012

(54) HALIDE FREE GLASSES HAVING LOW OH, OD CONCENTRATIONS

(75) Inventors: Richard Michael Fiacco, Corning, NY (US); Kenneth Edward Hrdina, Horseheads, NY (US); Rostislav Radievich Khrapko, Corning, NY (US); Lisa Anne Moore, Corning, NY (US); Charlene Marie Smith, Corning, NY (US)

(73) Assignee: Corning Incorporated, Corning, NY (US)

( * ) Notice: Subject to any disclaimer, the term of this patent is extended or adjusted under 35 U.S.C. 154(b) by 351 days.

(21) Appl. No.: 12/364,083

(22) Filed: Feb. 2, 2009

(65) Prior Publication Data

US 2009/0203512 A1    Aug. 13, 2009

Related U.S. Application Data

(60) Provisional application No. 61/063,894, filed on Feb. 7, 2008.

(51) Int. Cl.
*C03C 3/06* (2006.01)
*C03B 37/018* (2006.01)
*C03B 37/01* (2006.01)

(52) U.S. Cl. ............... 501/54; 65/414; 65/422; 65/426

(58) Field of Classification Search ............ 501/53, 501/54; 65/17.3, 17.4, 17.6, 414, 416, 421, 65/422, 426, 900
See application file for complete search history.

(56) References Cited

U.S. PATENT DOCUMENTS

| 6,813,908 B2 * | 11/2004 | Early et al. ............. 65/399 |
| 7,732,359 B2 * | 6/2010 | Bookbinder et al. ......... 501/54 |
| 2002/0194877 A1 * | 12/2002 | Chang et al. ............. 65/397 |
| 2006/0137397 A1 * | 6/2006 | Bookbinder et al. ........ 65/17.3 |
| 2006/0137399 A1 | 6/2006 | Allan et al. |
| 2006/0234848 A1 | 10/2006 | Kuehn et al. |
| 2007/0105703 A1 * | 5/2007 | Bookbinder et al. ......... 501/54 |
| 2007/0105704 A1 * | 5/2007 | Bookbinder et al. ......... 501/54 |

FOREIGN PATENT DOCUMENTS

| JP | 8133753 A | 5/1996 |
| WO | 2008140676 A2 | 11/2008 |
| WO | 2009017613 A1 | 2/2009 |

OTHER PUBLICATIONS

V.S. Khotimchenko et al "Determining the Content of Hydrogen Dissolved in Quartz Glass Using the Methods of Raman Scattering and Mass Spectrometry"; Translated from Zhurnal Prikladnoi Spektroskopii, vol. 46, No. 6, pp. 987-991, Jun. 1987. Original article submitted Dec. 30, 1986.

* cited by examiner

*Primary Examiner* — Noah Wiese
(74) *Attorney, Agent, or Firm* — Robert P. Santandrea

(57) ABSTRACT

A fused silica glass having a refractive index homogeneity of less or equal to about 5 ppm over an aperture area of at least about 50 cm$^2$. The fused silica glass is also substantially free of halogens and has an adsorption edge of less than about 160 nm. The glass is dried by exposing a silica soot blank to carbon monoxide before consolidation, reducing the combined concentration of hydroxyl (i.e., OH, where H is protium ($_1^1$H) and deuteroxyl (OD), where D is deuterium ($_1^2$H)) of less than about 20 ppm by weight in one embodiment, less than about 5 ppm by weight in another embodiment, and less than about 1 ppm by weight in a third embodiment.

28 Claims, 11 Drawing Sheets

FIG. 2
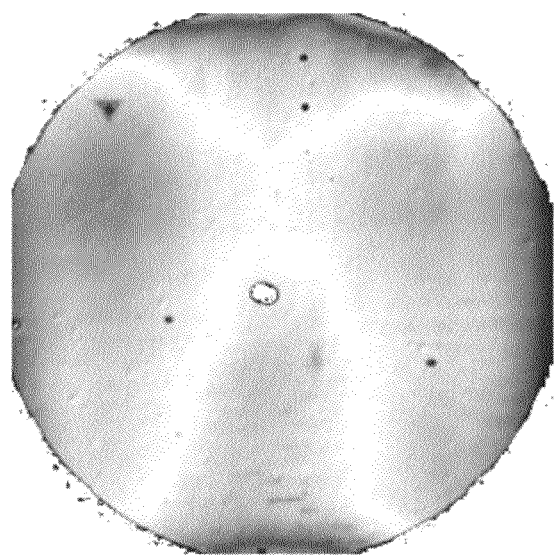
a
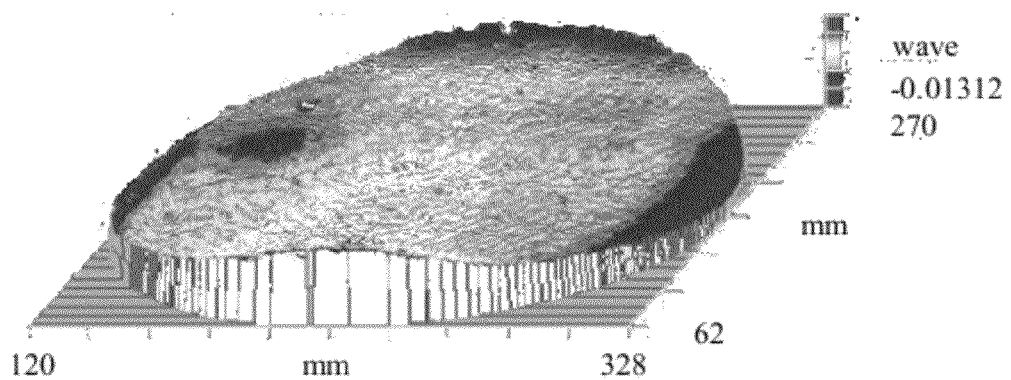
b

FIG. 5
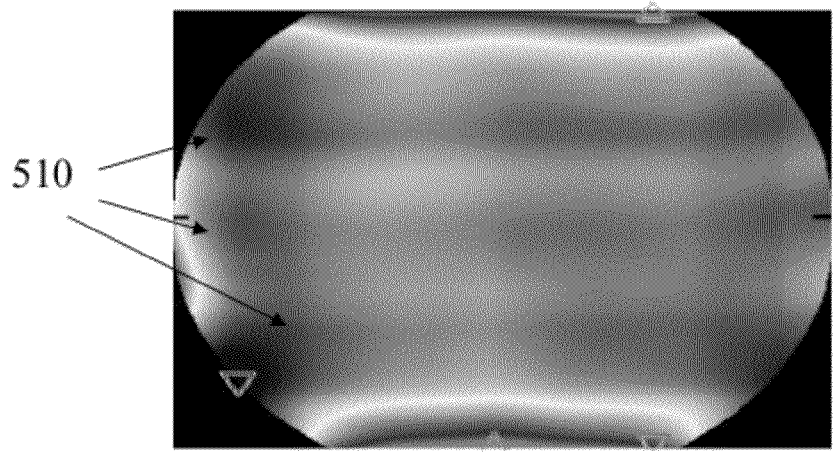
a
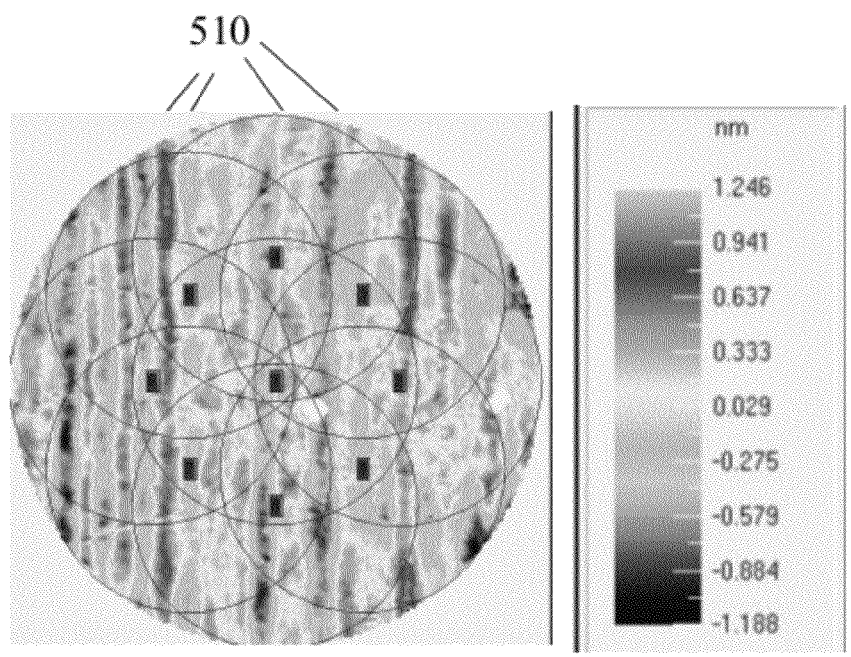
b

FIG. 6
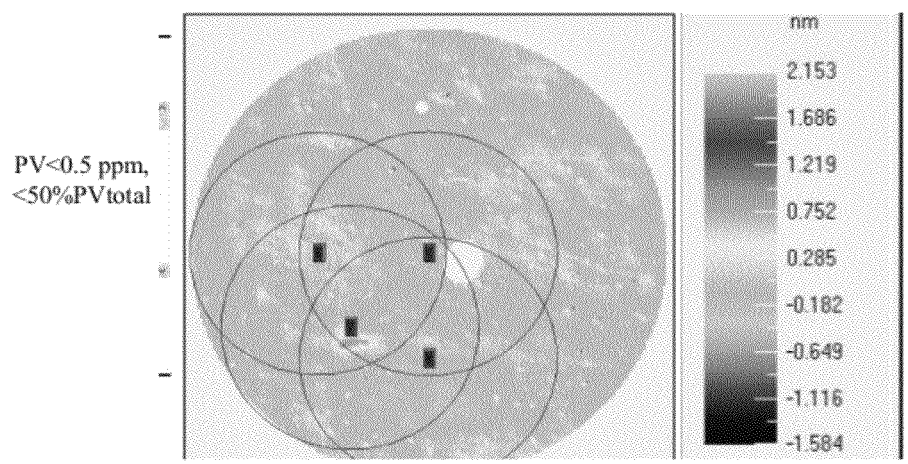
a
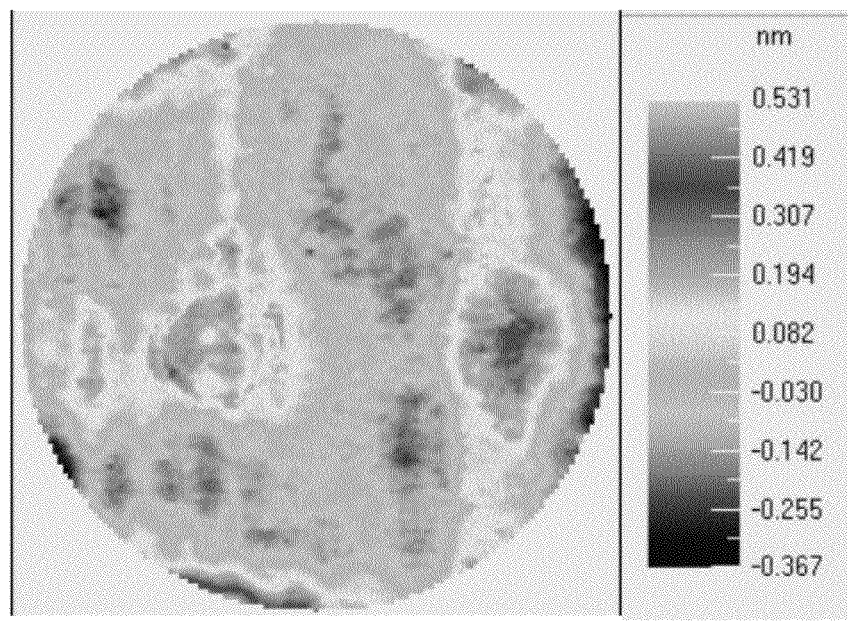
b

HALIDE FREE GLASSES HAVING LOW OH, OD CONCENTRATIONS

CROSS REFERENCE TO RELATED APPLICATIONS

This application claims the benefit of U.S. Provisional Application No. 61/063,894, filed Feb. 7, 2008.

BACKGROUND

The invention relates to fused silica glass. More particularly, the invention relates to fused silica glass having high levels of compositional and refractive index homogeneity. Even more particularly, the invention relates to fused silica glass having high levels of homogeneity and low levels of dopants.

High purity fused silica glass is used in the manufacture of precision lenses that operate in the ultra violet (UV) region of the radiation spectrum. Such lenses are used in the semiconductor area, and are particularly used in the projection optics train in steppers or scanners used in photolithography. In this application, the glass must possess high purity, very high homogeneity of the refractive index (also referred to herein as "refractive index"), and high transparency and stability against photo-induced changes in the UV region of the spectrum.

The purity, stability, high transparency, and index homogeneity of the fused silica glass is dependent on the level of dopants in the glass. Such dopants may be introduced during various processing steps. For example, hydroxyl (OH) dopants are typically introduced during formation of silica soot by flame hydrolysis. Halogens (fluorine, chlorine, bromine, iodine) are used to "dry" or remove water and OH from silica soot. Other dopants, such as molecular hydrogen (including molecular hydrogen enriched with certain isotopes, such as deuterium), and deuteroxyl (OD) groups are intentionally added to the fused silica during processing. Both dynamic properties and static properties of the fused silica glass are affected by the concentration levels of such dopants.

It is anticipated that future generations of optics used in lithography will require further reductions in the concentration levels of such dopants in fused silica glass optical members and higher levels of index homogeneity.

SUMMARY

The present invention meets these and other needs by providing a fused silica glass having a refractive index homogeneity of less or equal to about 5 ppm over an aperture area of at least about 50 cm$^2$. The fused silica glass is also substantially free of halogens and has an adsorption edge of less than about 160 nm. The glass is dried by exposing a silica soot blank to carbon monoxide before consolidation, reducing the combined concentration of hydroxyl (i.e., OH, where H is protium ($_1^1$H) and deuteroxyl (OD), where D is deuterium ($_1^2$H) to less than about 20 ppm by weight in one embodiment, less than about 5 ppm by weight in another embodiment, and less than about 1 ppm by weight in a third embodiment.

Accordingly, one aspect of the invention is to provide a fused silica article. The fused silica article has an index homogeneity less than or equal to about 5 ppm in at least one direction through the fused silica article over an aperture area of at least about 50 cm$^2$. The fused silica article has an absorption edge of less than about 160 nm and a combined concentration of fluorine, chlorine, and bromine of less than about 5 ppm by weight.

A second aspect of the invention is to provide a fused silica article. The fused silica article has a refractive index change PV of less than about 0.05 ppm over a 1 cm$^2$ area within an aperture of the fused silica article.

A third aspect of the invention is to provide a method of making a fused silica article. The method comprises the steps of: providing a silica soot blank comprising at least one of OH and OD; drying the silica soot blank by exposing the fused silica soot blank to CO to reduce a combined concentration of OH and OD in the fused silica soot blank below a predetermined level; exposing the dried fused silica soot blank to molecular oxygen, wherein the molecular oxygen converts CO into $CO_2$; and consolidating the dried silica soot blank to form the fused silica article, wherein the fused silica article exhibits an absorption edge of less than about 160 nm.

These and other aspects, advantages, and salient features of the present invention will become apparent from the following detailed description, the accompanying drawings, and the appended claims.

BRIEF DESCRIPTION OF THE DRAWINGS

FIG. 2a shows interferometry data obtained at 633 nm for a CO-dried fused silica glass part that has been doped with OD;

FIG. 2b is three dimensional view of the interferometry data shown in FIG. 2a;

FIG. 5a is a plot of interferometry data for a fused silica part that had not been dried using CO;

FIG. 5b is a plot of residual wavefront data for a fused silica part that had not been dried using CO;

FIG. 6a is a plot of residual wavefront data for a CO-dried fused silica part that has been doped with OD;

FIG. 6b is a plot of residual wavefront data for a CO-dried fused silica part that has been doped with OH;

DETAILED DESCRIPTION

Figure 1:
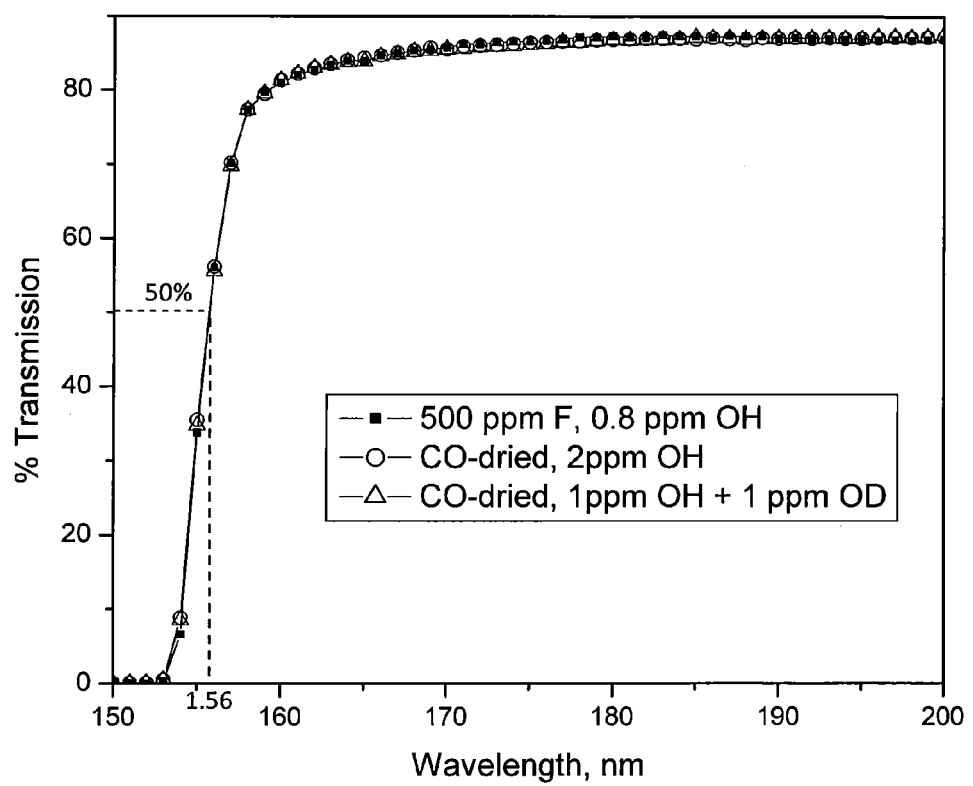
FIG. 1 shows vacuum ultraviolet (VUV) transmission spectra of a fluorine-doped fused silica glass dried and doped with fluorine and two samples of a fused silica glass that have been dried by exposure to CO and loaded with hydrogen.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range.

Referring to the drawings in general and to FIG. 1 in particular, it will be understood that the illustrations are for the purpose of describing particular embodiments of the invention and are not intended to limit the invention thereto.

As used herein, "protium" refers to the hydrogen isotope having a mass number of 1 and consisting of a single proton and electron. The symbols "H" and "$H_2$" refer to protium ($_1^1H$) atoms and molecules, respectively, unless otherwise specified. As used herein, the terms n(H) and n($H_2$) refer to the total number of protium atoms and molecules, respectively, in a material.

As used herein, the term "hydroxyl(s)" or OH means a moiety or a group of moieties each consisting of an oxygen atom and a protium atom ($_1^1H$, referred to herein as "H"), unless otherwise specified. As used herein, n(OH) means the total number of OH or hydroxyl moieties in a material.

As used herein, "deuterium" refers to the hydrogen isotope having one proton and one neutron in its nucleus, and having an atomic weight of 2.0144. The symbols "D" and "$D_2$" refer to deuterium ($_1^2H$) atoms and molecules, respectively, unless otherwise specified. As used herein, the terms n(D) and n($D_2$) refer to the total number of deuterium atoms and molecules, respectively, in a material.

As used herein, the term "deuteroxyl(s)" or OD means a moiety or a group of moieties, each consisting of an oxygen atom and a deuterium atom ($_1^2H$ or $_1^2D$, referred to herein as "D"). As used herein, n(OD) means the total number of OD moieties in a material. When hydroxyl and deuteroxyl groups are present in their natural isotopic abundance, the ratio of n(OD)/(n(OD)+n(OH)) in the material is equal to $2\times10^{-4}$.

As used herein, the terms "hydrogen" and "molecular hydrogen" refer to the naturally occurring mixture of protium and deuterium molecules and atoms (99.98% protium and 0.02% deuterium), unless otherwise stated.

As used herein, the term "hydrogen species" refers to any combination of the naturally occurring isotopes of hydrogen. Unless otherwise stated, hydrogen species include, for example: the naturally occurring mixture of protium and deuterium atoms and molecules; any other mixture of protium and deuterium atoms, molecules, and mixtures thereof, pure protium atoms, molecules, and mixtures thereof, and pure deuterium atoms, molecules, and mixtures thereof, unless otherwise stated.

Unless otherwise specified, when reference is made to any element other than hydrogen, it is understood that the element is present in its naturally occurring state; i.e., the isotopic distribution of the element is that which occurs in nature, and the element is not enriched in any one isotope.

High purity fused silica glass is used in the manufacture of precision lenses that operate in the ultra violet (UV) region of the radiation spectrum. Such lenses are used in the semiconductor area, and are particularly used in the projection optics train in steppers or scanners used in photolithography. In this application, the glass must possess high purity, very high homogeneity of the refractive index, and high transparency and stability in the UV region. Moreover, strict requirements for both dynamic properties such as light or laser induced wavefront distortion (LIWFD), induced absorption (IA), polarization induced birefringence (PIB), fluence dependent transmission (FDT), and the like, and static properties such as homogeneity, birefringence, transmission, and the like also exist for the glass.

Optical index homogeneity requires that any dopants, if present, should have a highly homogeneous distribution throughout a glass article. As optical homogeneity is required to be on the 5 part per million (ppm) level and, in one embodiment on a 1 ppm level, the dopant level distribution has to have a comparable level of homogeneity.

Further improvements are needed for future generations of optics, which will in turn require lower OH and OD levels than those currently present in optical components. The present invention identifies a means of achieving these levels by providing a fused silica glass having a halogen-free composition and a process for making such glass that leads to an overall improvement in the static and dynamic properties of the glass. The invention provides a fused silica article that has an index homogeneity that is less than or equal to about 5 ppm and, in some embodiments, less than or equal to about 1 ppm, in at least one direction or along at least one axis through the fused silica article. In one embodiment, that direction that is perpendicular to an optical path through the fused silica article. As used herein, the term "optical path" refers to the path along which radiation is directed through the fused silica article. For example, the optical path refers to the path along which laser radiation travels through a fused silica lens and optics train in a lithographic stepper/scanner system. In one embodiment, the index homogeneity is less than or equal to 0.6 ppm (600 parts per billion). As used herein, the term "index homogeneity" refers to the difference in refractive index as determined from PV, or maximum ("peak") and minimum ("valley"), values of refractive indices measured over a required or specified aperture. The fused silica described herein has the advantage of maintaining a stable index homogeneity over large surface or aperture areas. The index homogeneity is maintained over an aperture area of at least about 50 $cm^2$ and, in another embodiment, over an aperture area of at least about 75 $cm^2$, and, in a third embodiment over an aperture area of at least about 200 $cm^2$. In another embodiment, index homogeneity is maintained over an aperture area of at least about 600 $cm^2$ and, in yet another other embodiment, index homogeneity is maintained over an aperture area of at least about 2000 cm. In one embodiment, the fused silica article has a thickness of at least about 5 mm.

The fused silica glass article also has an absorption edge of less than about 160 nm. In one embodiment the absorption edge is less than or equal to about 158 nm. As used herein, the term "absorption edge" (λ(edge)) refers to the wavelength below 300 nm where the glass has a measured transmission of 50%/cm without surface reflection correction. For the purpose of measuring the absorption edge, only initial transmission (i.e., transmission of the glass that is substantially free of induced absorption due to exposure to UV light) is considered.

Dopants, such as the halogens fluorine, chlorine, and bromine, are frequently introduced during deposition or drying processes that occur during the process of forming fused silica. Some halogens, such as chlorine and fluorine, have an adverse affect on the static and/or dynamic properties of the fused silica article. Fluorine, for example, has a strong impact on refractive index, with small variations in fluorine concentration producing correspondingly large changes in the index. Rather than use halogens to dry or dehydrate the silica soot blank, the fused silica articles described herein are dried by exposing the silica soot blank to carbon monoxide (CO) at a temperature in a range from about 900° C. up to about 1400° C. in one embodiment, the silica soot blank is exposed to CO at a temperature in a range from about 1200° C. up to about 1300° C. prior to consolidation of the silica soot blank. Consequently, the fused silica glass described herein has a combined concentration of chlorine, fluorine, and bromine of less than about 1 ppm by weight. In one embodiment, the glass is substantially free of halogens. As used herein, "substantially free of halogens" means that none of the above-mentioned halogens is intentionally added to the glass or glass raw materials during any of the processing steps leading to the formation of the fused silica glass. It is understood that a fused silica glass article that is substantially free of halogens may inadvertently contain small amounts of halogens due to contamination.

FIG. 1 shows vacuum ultraviolet (VUV) transmission spectra of: 1) fluorine-doped fused silica glass that has been dried and doped with fluorine; and 2) two samples of the fused silica glass described herein, which have been dried by exposure to CO. The F-doped fused silica glass contains 0.8 ppm of residual OH by weight. One sample of the CO-dried fused silica glass contains 2 ppm of residual OH by weight and has been loaded with molecular hydrogen species, by exposing the glass to molecular hydrogen ($H_2$) in which protium and deuterium are present in their naturally occurring isotopic abundances, at 425° C. to a concentration between 0.1 and $1.0 \times 10^{17}$ molecules/cm$^3$, as measured by Raman spectroscopy, as described in "Determining the Content of Hydrogen Dissolved in Quartz Glass Using the Methods of Raman Scattering and Mass Spectrometry," by V. S. Khotimchenko et al. (Zh. Prikl. Spektrosk 46, 987-991 (1987)), the contents of which are incorporated by reference herein in their entirety. The second sample of CO-dried glass contains a mixture of 1 ppm residual OH and 2 ppm residual OD, and was loaded with molecular hydrogen ($H_2$) in which protium and deuterium are present in their naturally occurring isotopic abundances at 425° C. to a concentration between 0.1 and $1.0 \times 10^{17}$ $H_2$ molecules/cm$^3$. As seen in FIG. 1, the transmission of CO-dried fused silica glasses, which have OH, OD, and F dopant levels that are 100-200 times lower than that of the F-doped glass, have transmission values that are identical to that of the fluorine-doped glass.

The presence of chlorine, alkali metals, alkaline earth metals and transition metals all lead to transmission loss at 193 nm. Because the fused silica article described herein comprises less than about 5 ppm of chlorine and other halogens and, in another embodiment, substantially free of chlorine, fluorine, and bromine, the internal transmission losses due to the presence of these species is minimized or eliminated. In addition, the concentrations of alkali, alkali earth, and transition metals in the fused silica less than about 10 ppb and, in one embodiment, lower than 1 ppb. The fused silica article has an internal transmission of at least 99.7%/cm at a wavelength of about 193 nm and an induced absorption at 193 nm of less than about 0.002 cm$^{-1}$ when exposed to 5 billion pulses ($5 \times 10^9$) of a laser beam operating at a wavelength of about 193 nm, having a fluence of about 500 µJ·cm$^{-2}$·pulse$^{-1}$, and a pulse length of about 21 ns. In one embodiment, the induced absorption is less than about 0.0003 cm$^{-1}$ under the above conditions.

The fused silica article, in one embodiment, has an induced absorption at wavelengths between 155 nm and 180 nm of less than about 0.05 mm$^{-1}$ when subjected to 5 million pulses of a laser beam operating at about 157 nm and having a fluence of about 1.3 mJ·cm$^{-2}$·pulse$^{-1}$.

The fused silica article, in one embodiment, has a combined concentration of hydroxyl and deuteroxyl groups of less than about 20 ppm by weight. In another embodiment, the fused silica article has a combined concentration of OH and OH of less than about 5 ppm by weight. In a third embodiment, the combined concentration of OH and OD in the fused silica article is less than about 1 ppm by weight. Alternatively, the fused silica article has a combined concentration of hydroxyl and deuteroxyl groups in a range from about 20 ppm to about 50 parts per billion (ppb) by weight.

The optical homogeneity of the fused silica article depends in great part upon the homogenous distribution of dopants such as OH and OD in the fused silica article, particularly in a plane that is perpendicular to the optical path through the fused silica article. In one embodiment, the combined concentration of hydroxyl and deuteroxyl groups in the fused silica article varies by less than or equal to about 1 ppm by weight. As the size of optical components, such as lenses, increases, it is desirable that the distribution of such dopants be homogeneous of the entire area—or aperture—of the component. Accordingly, the combined concentration of hydroxyl and deuteroxyl groups in the fused silica article, in one embodiment, varies by less than or equal to about 2 ppm by weight in a direction perpendicular to the optical path over an aperture area of at least about 50 cm$^2$. In another embodiment, the combined concentration of hydroxyl and deuteroxyl groups in the fused silica article, varies by less than or equal to about 1 ppm by weight in a direction perpendicular to the optical path over this aperture area over an aperture area of at least 75 cm$^2$. In a third embodiment, the variation in the combined OH and OD concentration is less than or equal to about 1 ppm by weight in a direction perpendicular to the optical path over an aperture area of at least 200 cm$^2$.

Hydroxyl and deuteroxyl groups may be present in a relative concentration that is equivalent to the natural isotopic abundance of protium and deuterium: 99.98% OH and 0.02% OD. It has been found, however, that the presence of OD in larger concentrations relative to OH—i.e., $n(OD) > 2 \times 10^{-4}$— has a positive effect on the dynamic properties, such as laser induced wavefront distortion and the like, of the fused silica article. Accordingly, the fused silica article has concentration of OD relative to OH, in one embodiment, that is greater than the natural isotopic abundance of deuterium: i.e., $n(OD)/(n(OD)+n(OH)) \geq 2 \times 10^{-4}$. In one particular embodiment, the fused silica article is substantially free of OH groups and contains only deuteroxyl groups.

FIG. 2a shows interferometry data obtained for a CO-dried fused silica glass part of the present invention. The fused silica part has been doped with OD. The fused silica part has been rolled out to a cylindrical shape having a diameter of 10 inches (about 25 cm). A three dimensional view of the interferometry data obtained for the fused silica part is shown in FIG. 2b. Differences in index homogeneity are represented in a grayscale. As can be seen from FIGS. 2a and 2b, any changes in the index homogeneity of the fused silica part are gradual. Such gradual changes are advantageous in the optical performance of the fused silica article. The index homogeneity of the fused silica part shown in FIGS. 2a and 2b is about 0.5 ppm.

Figure 3:
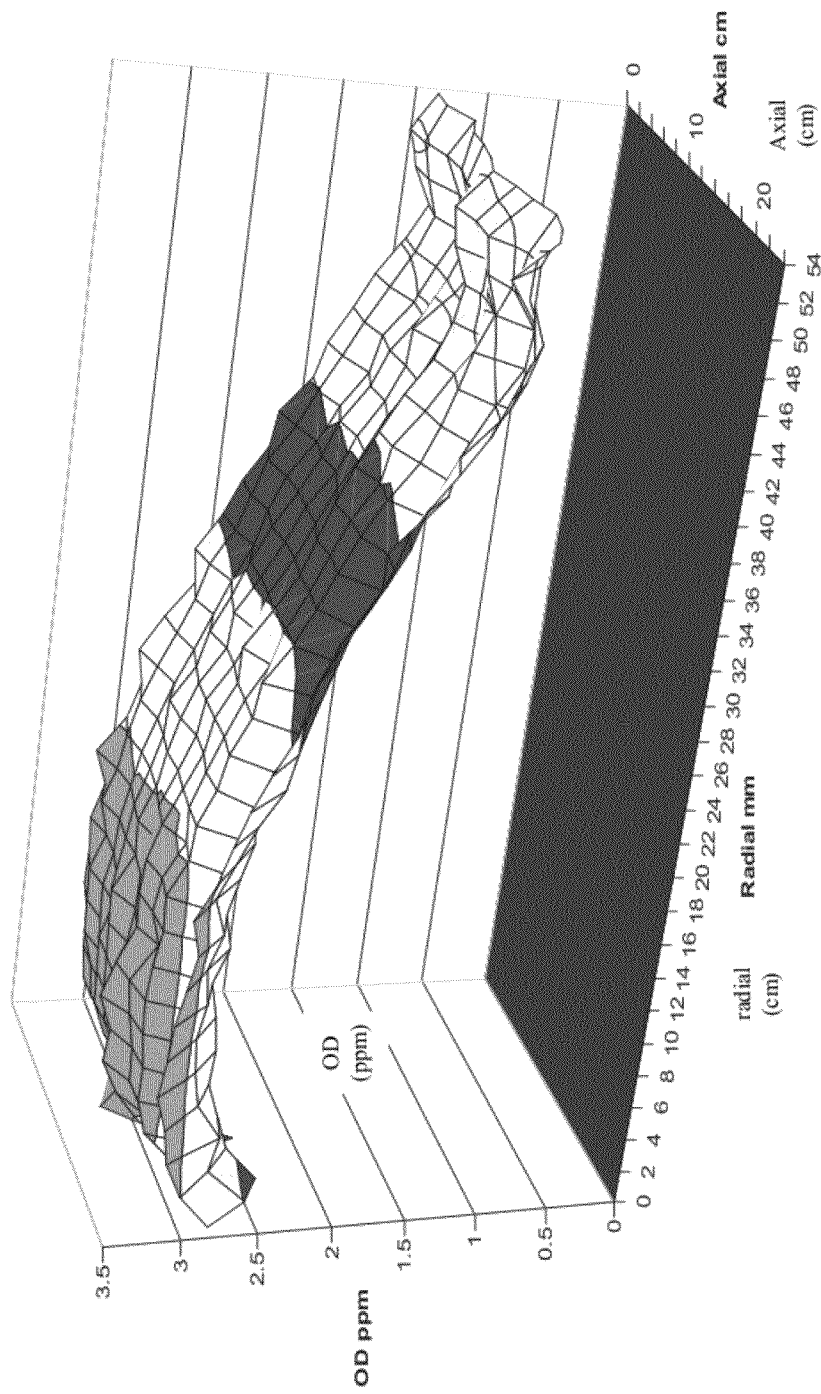
FIG. 3 is a plot of OD concentration measured by infrared spectroscopy in the fused silica part shown in FIGS. 2a and 2b as a function of position.

As previously mentioned, optical homogeneity of the fused silica article depends upon the homogenous distribution of dopants such as OH and OD. The OD concentration, determined from FTIR spectroscopic data, in the fused silica part shown in FIGS. 2a and 2b is plotted as a function of position in FIG. 3. The OD concentration ranges from about 3 ppm to about 1 ppm.

In one embodiment, the fused silica article is loaded with at least one of molecular protium ($H_2$) and molecular deuterium ($D_2$). The combined concentration of molecular protium, molecular deuterium, and mixed molecular hydrogen species (e.g., HD) in the fused silica article is in a range from about $1 \times 10^{16}$ molecules/cm$^3$ up to about $1 \times 10^{17}$ molecules/cm$^3$. In one embodiment, the fused silica article is loaded under an atmosphere comprising the naturally occurring mixture of protium and deuterium (i.e., $H_2$, HD, and $D_2$, where deuterium comprises 0.02% of the hydrogen present). In another embodiment, the fused silica article is loaded under an atmosphere comprising hydrogen that is enriched in deuterium, and has a concentration of deuterium relative to protium that is greater than the natural isotopic abundance of deuterium: i.e., $n(D)/(n(D)+n(H)) \geq 2 \times 10^{-4}$. In one particular embodiment, the fused silica article is substantially free of molecular protium and contains only molecular deuterium.

When a fused silica glass article, such as, for example, a lens, is exposed to radiation from short wavelength lasers operating in the UV, deep UV (DUV), and vacuum UV wavelengths, the radiation causes damage in a region of the fused silica article. Such lasers include, but are not limited to, those operating at about 248 nm, 193 nm, 157 nm, and even shorter wavelengths.

One consequence of such radiation-induced damage is polarization-induced birefringence (PIB). As used herein, the term polarization-induced birefringence refers to the numerical difference between the peak measured birefringence level in the center portion of the uniformly exposed area of the fused silica glass after a certain time interval or number of laser pulses when a polarized laser beam is used for exposure and the initial birefringence of the glass before exposure to radiation. The PIB level of a fused silica sample may be induced by directing a linearly polarized pulsed laser beam having a wavelength of approximately 193 nm and a beam diameter of about 3 mm with a given fluence, expressed in $\mu J \cdot cm^{-2} \cdot pulse^{-1}$, and pulse length, typically on the order of tens of nanoseconds, to a fixed area of the fused silica sample. The measured birefringence at the center portion of the exposed area is measured after a certain number of pulses. The PIB value is then calculated by subtracting the initial birefringence of the glass from the measured center birefringence. The relationship between polarization-induced birefringence, pulse number and fluence can tentatively be described as $PIB = a \cdot N \cdot F$ with a being a sample-dependent factor, N being the number of pulses, F being the fluence, and PIB being the level of polarization-induced birefringence.

In one embodiment, the fused silica article exhibits a polarization induced birefringence of less than about 1 nm/cm, when subjected to 5 billion pulses of a laser beam operating at about 193 nm, the laser beam having a fluence of about 500 $\mu J \cdot cm^{-2} \cdot pulse^{-1}$, and a pulse length of about 21 ns. In a particular embodiment, the fused silica article has a polarization induced birefringence of less than about 0.5 nm/cm over an area of at least 25 cm$^2$.

Another result of such radiation induced damage to a fused silica article is wavefront distortion (WFD). Simply stated, wavefront distortion may be described as the distortion of a wavefront from its original or intended shape as it travels through an optical component. Such distortion is caused by deviations or inhomogeneities within the fused silica article. WFD is often characterized by the peak-to-valley (PV) deformation of the emergent wavefront from its intended shape and is normally expressed in fractions of a wavelength. Such wavefront distortion may be induced when radiation by a laser or other light source creates inhomogeneities in physical properties—such as, for example, density—of the fused silica, by exposure to light, such as a laser (hence the terms light induced wavefront distortion and laser induced wavefront distortion (LIWFD).

In one embodiment, the fused silica article exhibits a light or laser induced wavefront distortion, measured at a wavelength of 633 nm, of less than about 3.0 nm/cm, when subjected to 5 billion pulses of a laser beam operating at about 193 nm, the laser beam having a fluence of about 500 $\mu J \cdot cm^{-2} \cdot pulse^{-1}$, a pulse length of about 21 ns.

Figure 4:
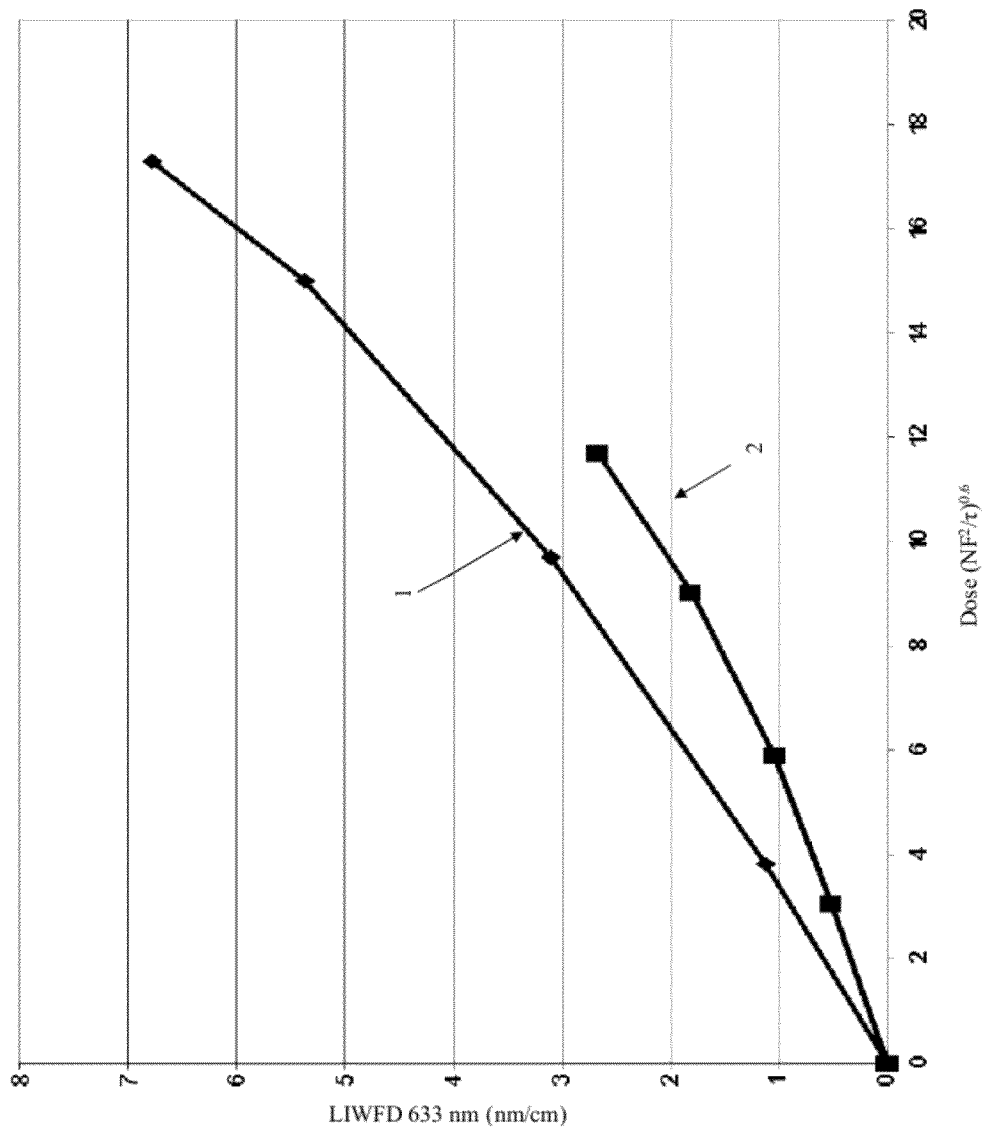
FIG. 4 is a plot comparing laser damage for: 1) a fused silica part that had not been dried using CO; and 2) a CO-dried fused silica glass.

FIG. 4 is a plot comparing laser damage for: 1) a fused silica part that had not been dried using CO, as described herein; and 2) a CO-dried fused silica glass, as described herein. Laser damage is expressed in terms of LIWFD data and plotted as a function of dose, expressed as $(NF^2\tau)^{0.6}$, where N is the number of pulses in millions, F is the fluence expressed in $mJ \cdot cm^{-2} \cdot pulse^{-1}$, and $\tau$ is the pulse length expressed in nanoseconds. Data obtained for CO-dried fused silica parts include fused silica parts doped with OD and subsequently loaded with hydrogen species. The CO-dried fused silica exhibits less laser damage than the standard fused silica that had not been dried using CO.

It is common for the fused silica formed by a soot generation process to contain inhomogeneities such as multiple striae and event striae, the latter of which includes radial inflections or discontinuities. As used herein, the term "multiple striae" refers to periodic occurrences or inhomogeneities such as, for example, fluctuations in refractive index. The periodicity of such occurrences ranges up to about 5 mm in distance. As used herein, the term "event striae" refers to a single event or multiple events or occurrences that are non-repetitive or random on a scale of at least 1 mm. Such occurrences include changes in refractive index that occur over a range of 0.5 mm or more and have an amplitude of at least 0.01 ppm.

In the fused silica articles described herein, the number and intensity of multiple and event striae are significantly reduced in comparison to fused silica that is not dried using CO, as described herein. The reduction in number and intensity of striae in the fused silica article is characterized by a refractive index change PV of less than about 0.05 ppm, or less than about 5% of the total index change $PV_{total}$, over any 1 cm$^2$ area within the optic or aperture of the fused silica article. In one embodiment, the fused silica article described herein is substantially free of multiple striae in a plane that is perpendicular to an optical path through the article. In another embodiment, the fused silica article is substantially free of event striae in a plane that is perpendicular to the optical path.

Interferometry data for a fused silica part that had not been dried using CO as a drying agent, as described herein, having a OH concentration of about 60 ppm by weight is shown in FIG. 5a. The fused silica part exhibits bands of inhomogeneities 510, or "banding," due to the presence of inhomogeneities introduced during the deposition of silica soot.

The fused silica glasses described herein comprise lower levels of dopants. Consequently, such bands of inhomogeneities as described above are substantially reduced in both amplitude and frequency. The reduction in the degree and intensity of banding in the fused silica article is characterized by a refractive index change PV of less than about 0.5 ppm, or less than about 25% of the total index change $PV_{total}$, over any 25 cm² area within the optic or aperture of the fused silica article. In another embodiment, the index change PV is less than about 50% of the total index change $PV_{total}$, over any 25 cm² area within the optic or aperture of the fused silica article. Residual wavefront data for CO-dried fused silica glass of the present invention, shown for glasses doped with either OD or OH in FIGS. 6a and 6b, respectively, do not reveal the presence of banding in either of these materials.

A method of making the fused silica article described hereinabove is also provided. A silica soot blank—or perform—is first provided. The silica soot blank may be formed by methods known in the art such as, but not limited to, deposition methods in which a gas stream containing at least one silicon-containing precursor compound in vapor form is produced. Silicon precursor compounds include, but are not limited to, halogen-containing compounds such as $SiCl_4$, $SiBr_4$, $SiF_4$, and the like. Silicon precursor compounds also include, but are not limited to, halogen-free cyclosiloxane compounds such as, for example, polymethylsiloxanes. Such polymethylsiloxanes include hexamethyldisiloxane, polymethylcyclosiloxane, octamethylcyclotetrasiloxane (OMCTS), decamethylcyclopentasiloxane, hexamethylcyclotrisiloxane, and combinations thereof. Deposition methods that are typically used to form the soot blank include outside vapor deposition (OVD), planar soot deposition (PSD), vapor axial deposition (VAD) processes, and the like. The gas stream containing the silicon-containing compound is passed into the flame of a combustion burner to form amorphous particles of fused silica soot. The fused silica particles are deposited onto a support, such as a supporting core cane, a mandrel, or the like to form the silica soot blank. The support may be removed following deposition of the soot.

In those embodiments where a fused silica article comprising a predetermined concentration of deuteroxyl (OD) groups is desired, OD groups may be exchanged for hydroxyl (OH) groups in the soot blank using a process in which gases comprising up to 100% $D_2O$, or, preferably, 0.5-3% $D_2O$ are flowed past the perform at temperatures in a range from about 500° C. up to about 1300° C. for a time period ranging from about 0.5 hours up to about 1000 hours. In one embodiment, the time period ranges from about 1 hour up to about 10 hours. In another embodiment, the gases comprising $D_2O$ are flowed past the preform at temperatures in a range from about 10001° C. up to about 1200° C.

The silica soot blank is then dried—i.e., dehydrated—by exposing the soot blank to carbon monoxide (CO) to reduce the combined concentration of OH and OD in the soot blank below a predetermined level. The silica soot blank is exposed to CO at a temperature in a range from about 900° C. up to about 1400° C. In one embodiment, the silica soot blank is exposed to CO at a temperature in a range from about 1200° C. up to about 1300° C. In one embodiment, the predetermined level of the combined concentration of OH and OD in the soot blank is less than about 10 ppm by weight. In another embodiment, the predetermined level of the combined concentration of OH and OD in the soot blank is less than about 5 ppm by weight. Unless otherwise specified, the drying step is carried out in an atmosphere in which the gas is continuously flowed or "swept" over the soot blank. In those embodiments where the atmosphere does not consist solely of CO, the atmosphere may further comprise at least one inert or relatively unreactive gas such as, but not limited to, helium, argon, nitrogen, neon, and the like.

The drying step, in one embodiment, is carried out in a substantially halogen-free atmosphere. As used herein, "substantially halogen-free" means that halogens (fluorine, chlorine, bromine, and iodine) are not intentionally added to the fused silica in either elemental form or as a halogen-containing compound. It is understood that the fused silica may inadvertently contain small amounts of halogen due to contamination. In one embodiment, the halogen-free atmosphere comprises from about 0.5% up to about 10% carbon monoxide. In one particular embodiment, the halogen-free atmosphere comprises about 1% CO. The mechanism for drying may be based on the reaction between CO and OH (or OD) to yield protium (or deuterium) and carbon dioxide.

Following drying of the soot blank with CO, the silica soot blank is heated at a temperature in a range from about 1000° C. up to about 1260° C. in an atmosphere comprising oxygen and an inert gas such as, but not limited to, helium. The oxygen should essentially be free of water. The oxygen concentration in the oxygen-helium mixture ranges from about 0.1% up to 100%. In one embodiment, the oxygen concentration is in a range from about 0.5% up to about 5%. In one particular embodiment, the dried soot blank is heated at 1225° C. in an atmosphere comprising 2% oxygen in helium for one hour. The sweeping of the dried soot blank with a mixture of oxygen and helium ensures complete conversion of CO to carbon dioxide ($CO_2$) and repairs any damage to the soot blank caused by CO drying. The oxygen sweep also re-oxidizes the silica and prevents formation of any oxygen-deficient centers.

The open porosity of the silica soot blank enables more effective drying and removal of water, hydroxyl, and deuteroxyl groups by carbon monoxide. Open porosity also allows the oxygen sweep to better permeate the soot blank and more effectively mitigate any damage to the silica caused by the CO drying step.

After the soot blank has been dried and, optionally, swept with an oxygen-helium mixture as described above, the dried silica soot blank is sintered or consolidated under conditions that are known in the art to form the fused silica article described herein. In one embodiment, the soot blank is consolidated at a temperature of up to about 1500° C. in an inert gas atmosphere containing from 0.5% up to 2% oxygen to form the fused silica article.

In order to obtain the desired final dimensions and shape, the consolidated fused silica article may optionally be reworked by those means known in the art, such as, but not limited to, rolling out, squashing, and the like.

The consolidated fused silica article may optionally be loaded with at least one of the molecular hydrogen species molecular protium, the mixed molecular species HD, and molecular deuterium by heating the fused silica article in the presence of an atmosphere comprising hydrogen in its naturally occurring isotopic mixture (i.e., 99.98% protium, 0.02% deuterium) or hydrogen that has been enriched in either deuterium or protium. Such molecular species react with and neutralize any residual oxygen-rich species, forming small amounts of corresponding hydroxyl and deuteroxyl species. In one embodiment, the consolidated fused silica article is heated at about 425° C. and held for at that temperature for 14 days under an atmosphere comprising 4% $H_2$ with the balance being nitrogen pressurized to 78.3 psig. After the specified time period at 425° C., the furnace is allowed to cool to room temperature.

At temperatures below about 500° C., molecular hydrogen species (i.e., $H_2$, HD, $D_2$) are incorporated into fused silica with little reaction with the $SiO_2$ lattice. At temperatures greater than about 500° C., however, molecular hydrogen species react with the lattice, forming silicon hydride (SiH) or deuteride (SiD) and silicon hydroxide (SiOH) or deuteroxide (SiOD). Generally, as the initial hydroxyl (or deuteroxyl) content of the fused silica glass decreases and the temperature at which the fused silica is loaded with molecular hydrogen species, more reaction of the hydrogen species takes place, yielding more SiH and SiOH and/or SiD and SiOD. Loading of fused silica at temperatures of less than 500° C. and, in one embodiment, between 30° C. and 500° C., is therefore preferable to minimize the effects of these species.

The presence of hydride (and/or deuteride) or hydroxyl (and/or deuteroxyl) groups affects the dynamic properties of fused silica. "Dynamic properties" are those properties that are functions of exposure to light and include, transmission, wavefront distortion (including LIWFD), and induced birefringence (including PIB).

To achieve the OH and OD concentrations described herein, the method described hereinabove is carried out in a furnace (or furnaces) in which the amount of water (i.e., $H_2O$, $D_2O$, HDO) is maintained at low levels. The maintenance of low water levels within the furnace keeps the concentrations of OH and OD groups in the fused silica article below the desired levels. Small leaks within the furnace allow ambient air to enter the furnace, resulting in a significant partial pressure of water within the furnace. Accordingly, the amount of leakage of ambient air into the furnace must be minimized using those means known in the art. In one embodiment, such leakage is minimized or neutralized by maintaining the interior of the furnace at a pressure that is greater than ambient pressure, thus preventing or minimizing the ingress of water vapor into the furnace.

EXAMPLE

The following example illustrates the features and improvements offered by the invention, and is in no way intended to limit the invention thereto. Unless otherwise specified, the terms "OH" and "$H_2$," as used in the following examples, refer to species comprising the naturally occurring mixture of protium and deuterium.

A high purity fused silica perform was prepared using an outside vapor deposition process. The consolidation process for making halogen-free glasses having less than 5 ppm OH or OD by weight included a drying step in which the silica soot perform was exposed to a atmosphere comprising CO and He. The dried soot preform was subsequently exposed to and swept by an $O_2$—He atmosphere in order to minimize the level of oxygen-deficient centers in the glass. The consolidation process for making OD-doped glasses included a step in which OH in the silica preform was exchanged with OD through a process in which gases containing $D_2O$ were flowed past the preform. The part was exposed to a an atmosphere containing molecular hydrogen ($H_2$) in its naturally occurring isotopic mixture (i.e., 99.98% protium, 0.02% deuterium) at a temperature of about 425° C. to allow molecular hydrogen species to be incorporated into the glass by a diffusion process.

To test the vacuum ultraviolet (VUV) laser damage resistance of the different silica glasses, samples, each having a thickness of 1 mm and polished faces were prepared and irradiated with a 157 nm $F_2$ excimer laser having a 3 mm spot size and operating at 1.3 $mJ \cdot cm^{-2} \cdot pulse^{-1}$, 200 Hz with a pulse length of about 30 ns. Prior to exposure and after every $0.5 \times 10^6$ pulses, the sample was removed from the laser beam and the UV absorption spectrum (200-400 nm) of the exposed area was measured using a Cary spectrophotometer and a 2 mm aperture. The absorption spectra of the exposed and unexposed areas were normalized at 400 nm and subtracted to obtain the UV induced absorption (UV-IA) spectrum. Glasses that were not loaded with molecular hydrogen were exposed to a total of 5 million ($5 \times 10^6$) pulses. Samples that had been loaded with $H_2$ were exposed to a total of 9.5 million ($9.5 \times 10^6$) pulses. After the total exposure was complete, VUV (150-220 nm) absorption spectra were taken on the exposed and unexposed areas of the sample using a McPherson VUV spectrophotometer and a 4.5 mm aperture. The absorption spectra of the exposed and unexposed glass were subtracted to obtain the VUV-IA spectrum, which was then adjusted to match the UV-IA spectrum at 220 nm. Infrared (IR) spectroscopic measurements were also made to determine the OH or OD contents of the samples.

Figure 7:
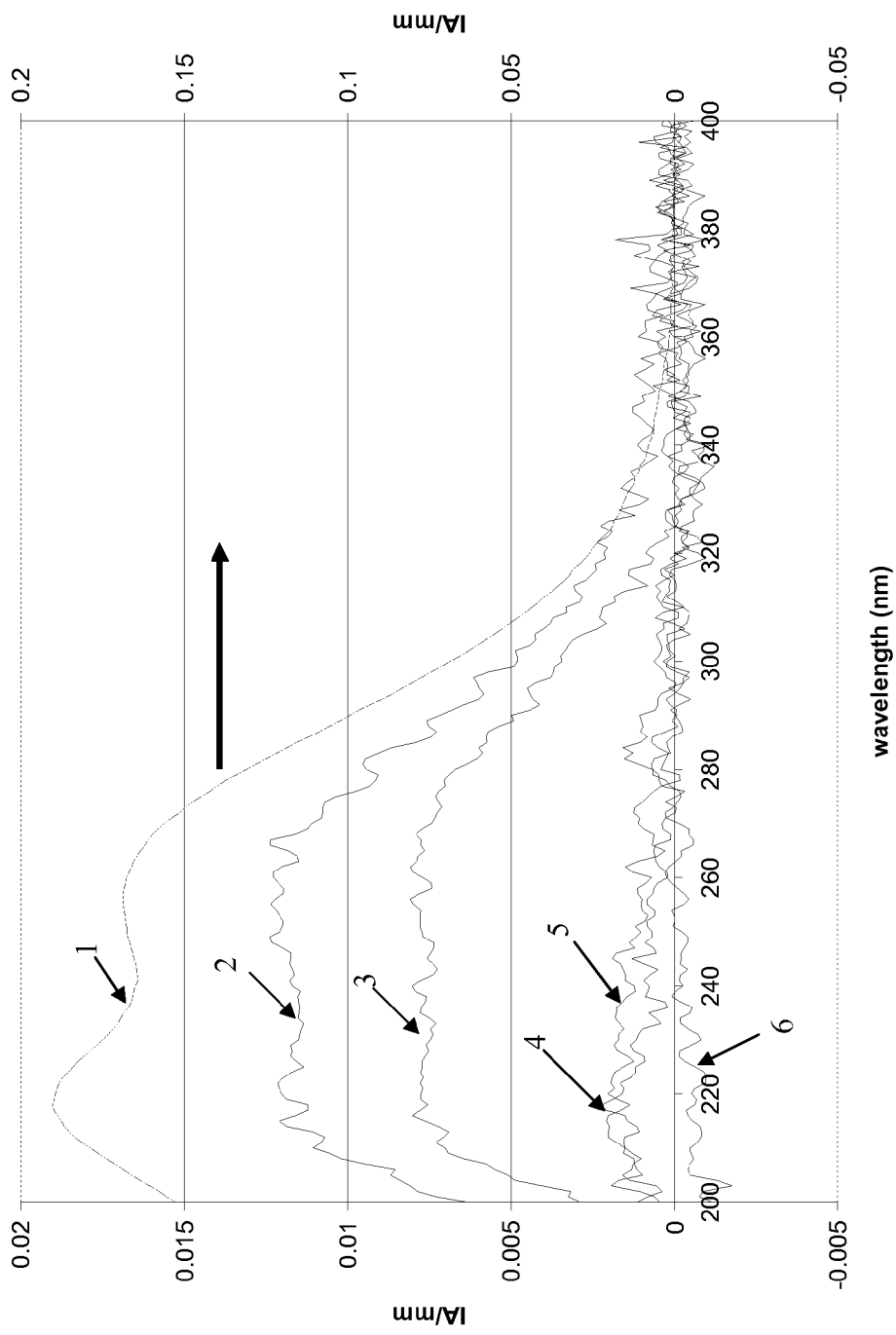
FIG. 7 is a plot of induced absorption (200-400 nm) spectra for CO-dried, halogen free, low OH, low OD fused silica glasses, a silica glass containing about 100 ppm OH by weight that had not been dried using CO, and a fluorine-dried fused silica glass containing 5000 ppm F by weight.

FIG. 7 shows UV-IA spectra for: 1) a fused silica sample that had not been dried with CO, not loaded with molecular hydrogen, and containing 99 ppm OH by weight; 2) a fused silica sample dried with CO, containing 3 ppm OD by weight, not loaded with molecular hydrogen; 3) a fused silica sample dried with CO, containing 1.8 ppm OH by weight, not loaded with molecular hydrogen; 4) a fused silica sample dried with CO, containing 1.8 ppm OH by weight, loaded with molecular hydrogen; 5) a fused silica sample dried with CO, containing 3 ppm OD by weight, loaded with molecular hydrogen; and 6) a fused silica sample, containing 5000 ppm fluorine by weight and no OH, that had not been dried with CO and not loaded with molecular hydrogen. The four CO-dried, halogen free, low OH, low OD fused silica glasses (samples 2-5) of the present invention were prepared according to the methods described herein. Samples that had not been loaded with hydrogen species (samples 2 and 3) were exposed to a $F_2$ (157 nm) excimer laser having a fluence of 1.3 $mJ \cdot cm^{-2} \cdot pulse^{-1}$ for 5 million ($5 \times 10^6$) pulses, whereas samples loaded with hydrogen species (samples 4 and 5) were exposed to the same fluence of $F_2$ excimer laser radiation for 9.5 million pulses. For comparison, a silica glass containing about 100 ppm OH by weight (sample 1) and a fluorine-dried fused silica glass containing 5000 ppm F by weight (sample 6) are also shown in FIG. 7. The spectra were taken after exposing the glasses to a 157 nm $F_2$ excimer laser with a fluence of 1.3 $mJ \cdot cm^{-2} \cdot pulse^{-1}$ for 5 million pulses. The IA values for the glass containing 99 ppm OH are on the right axis of FIG. 7, and the IA values for the remaining samples are on the left axis of the figure. The absorption band at about 220 nm is the signature of E' centers—a three-coordinated silicon (≡Si.) formed by the breaking of silicon-oxygen bonds by laser radiation. The 256 nm absorption band is the signature of non-bridging oxygen hole centers (≡SiO.), also referred to herein as "NBOHC." The data show that the formation of E' centers is suppressed in the CO-dried, halogen-free silica fused silica glasses with low OH and OD levels of the present invention.

Figure 8:
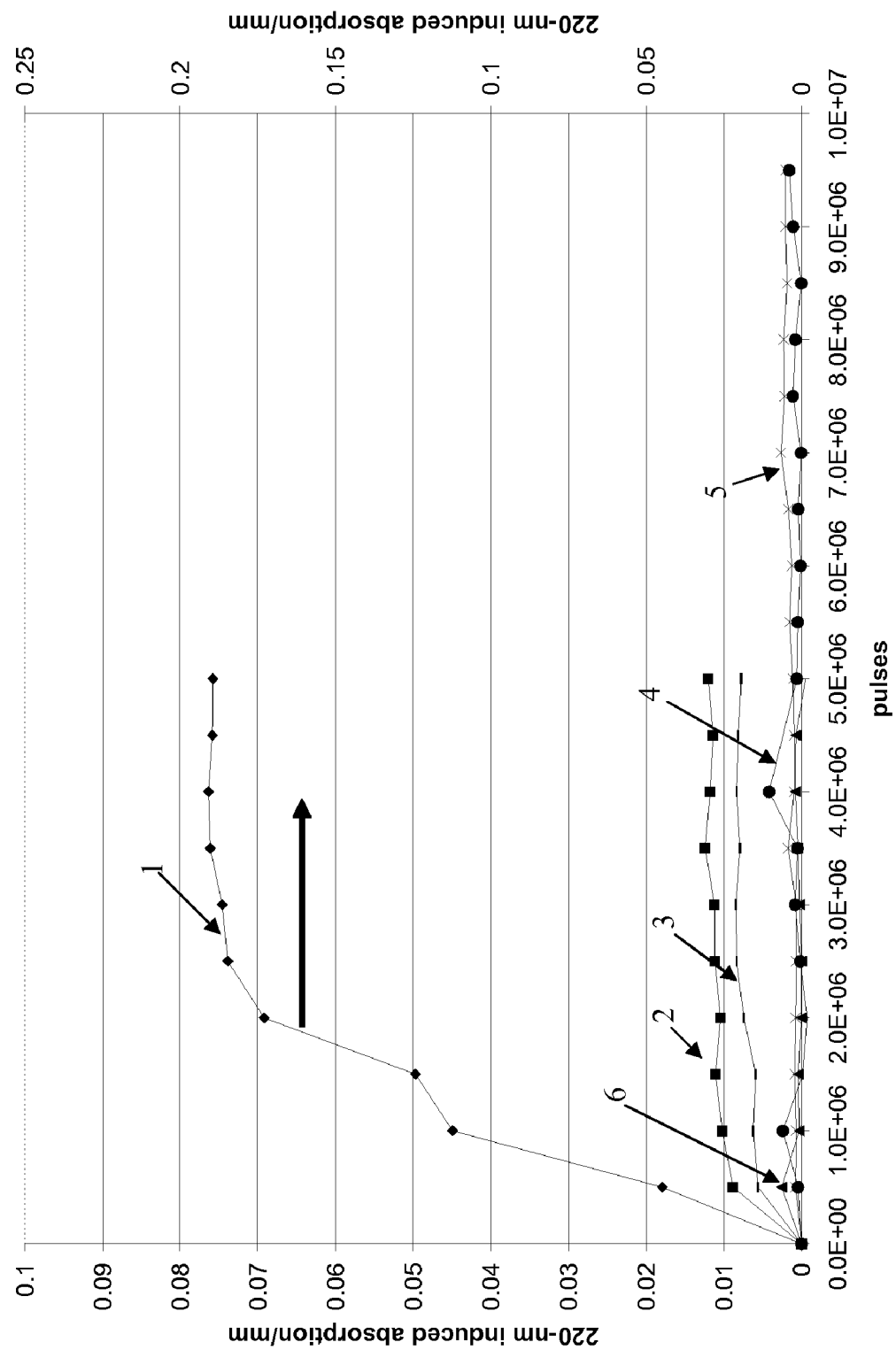
FIG. 8 is a plot of induced absorption at 220 nm as a function of pulse count for CO-dried, halogen free, low OH, low OD fused silica glasses of the present invention, a silica glass containing about 100 ppm OH by weight and a fluorine-dried fused silica glass containing 5000 ppm F by weight.

FIG. 8 is a plot of 157 nm induced absorption at 220 nm as a function of pulse count for: 1) a fused silica sample that had not been dried with CO, not loaded with molecular hydrogen, and containing 99 ppm OH by weight; 2) a fused silica sample dried with CO, containing 3 ppm OD by weight, not loaded with molecular hydrogen; 3) a fused silica sample dried with CO, containing 1.8 ppm OH by weight, not loaded with molecular hydrogen; 4) a fused silica sample dried with CO, containing 1.8 ppm OH by weight, loaded with molecular hydrogen; 5) a fused silica sample dried with CO, containing 3 ppm OD by weight, loaded with molecular hydrogen; and 6) a fused silica sample, containing 5000 ppm fluorine by weight and no OH, that had not been dried with CO and not loaded with molecular hydrogen. The CO-dried, halogen free, low OH, low OD fused silica glasses (samples 2-5), of the present invention were prepared according to the methods described herein. Samples that had not been loaded with hydrogen species (samples 2, 3) were exposed to a 157 nm $F_2$ excimer laser having a fluence of 1.3 mJ·cm$^{-2}$·pulse$^{-1}$ for 5 million pulses, whereas samples loaded with hydrogen species (samples 4, 5) were exposed to the same fluence of $F_2$ excimer laser radiation for 9.5 million pulses. For comparison, a silica glass containing about 100 ppm OH by weight (sample 1) and a fluorine-dried fused silica glass containing 5000 ppm F by weight (sample 6) are also shown in FIG. 8. The IA values obtained for the glass containing 99 ppm OH are on the right axis of FIG. 8, and the IA values for the remaining samples are on the left axis of the figure. FIG. 8 shows how the induced absorption at 220 nm develops and reaches saturation under the $F_2$ excimer laser in different types of fused silica glasses. The halogen-free low OH and low OD glasses of the present invention, when irradiated by the $F_2$ excimer laser, exhibited very low levels of E' center and NBOHC formation, as indicated by the induced absorption (IA) at 220 nm and 256 nm IA, respectively. The halogen-free, low OH and low OD fused silica glasses of the present invention saturated at a lower pulse count than the comparison fused silica glasses having higher OH and OD concentrations. Hydrogen ($H_2$) loading significantly reduced induced absorption at both 220 nm and 256 nm in the CO-dried glasses of the present invention to an IA level approaching that of fluorine-dried, F-doped fused silica glass.

Figure 9:
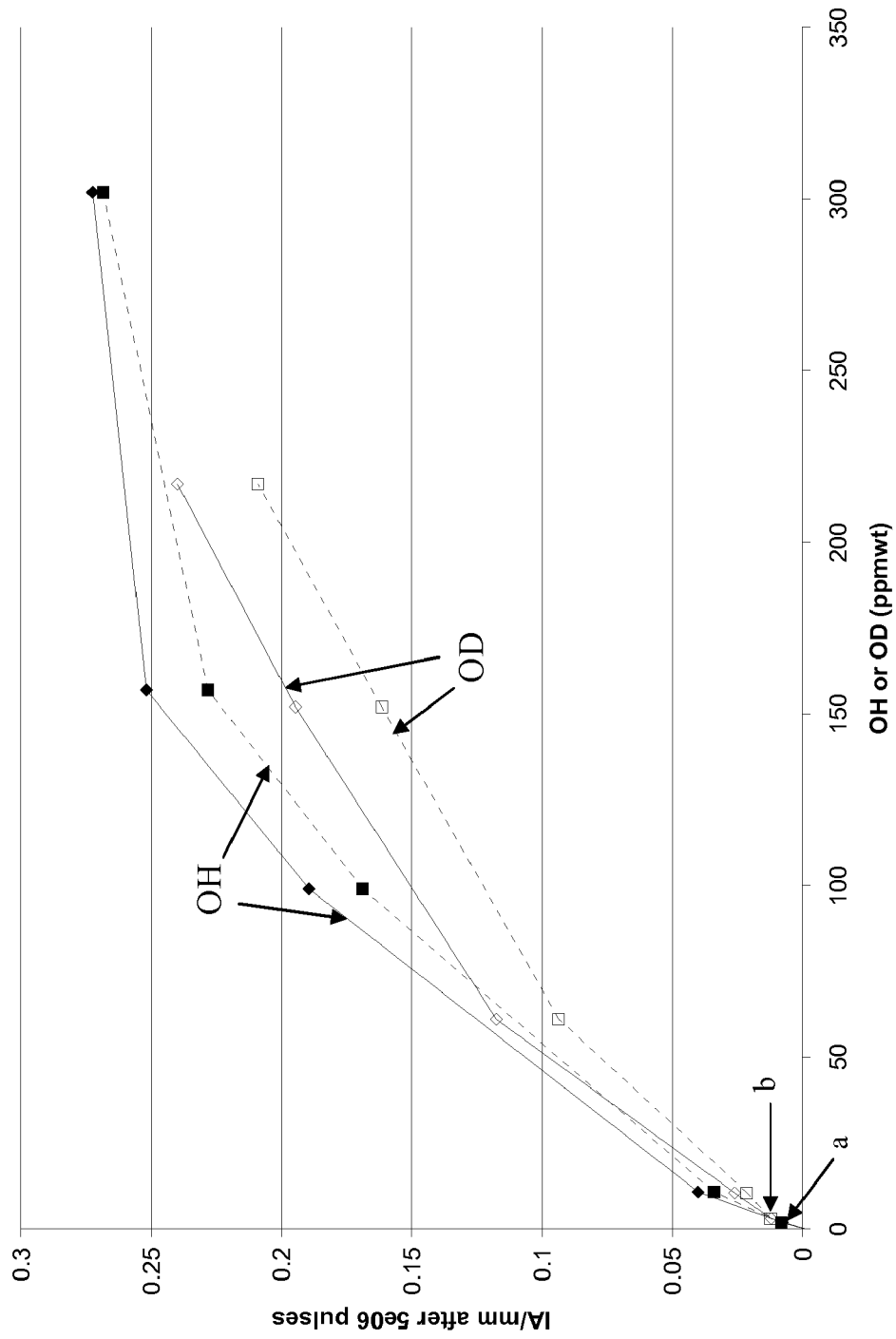
FIG. 9 is a plot of induced absorption for fused silica glasses as a function of OH or OD concentration.

Induced absorption at 220 nm and 256 nm after $5\times10^6$ pulses of the $F_2$ excimer laser at 1.3 mJ·cm$^{-2}$·pulse$^{-1}$ are plotted for fused silica glasses, which were not loaded with molecular hydrogen, as a function of OH or OD concentration, expressed in ppm by weight, in FIG. 9. Points a and b represent CO-dried fused silica glasses of the present invention containing OH and OD, respectively. The formation of E' and NBOHC centers, as indicated by induced absorption at 220 nm (solid lines in FIG. 9) and 256 nm (dashed lines in FIG. 9), respectively, is lower in OD-containing fused silica glasses than in OH-containing fused silica glasses for the same concentration of dopant, and decreases with decreasing OH or OD content. The CO-dried fused silica glasses of the present invention have the lowest OH and OD content (points a and b, respectively), and thus exhibit the lowest induced absorption at both 220 nm and 256 nm, as shown in FIG. 9.

Figure 10:
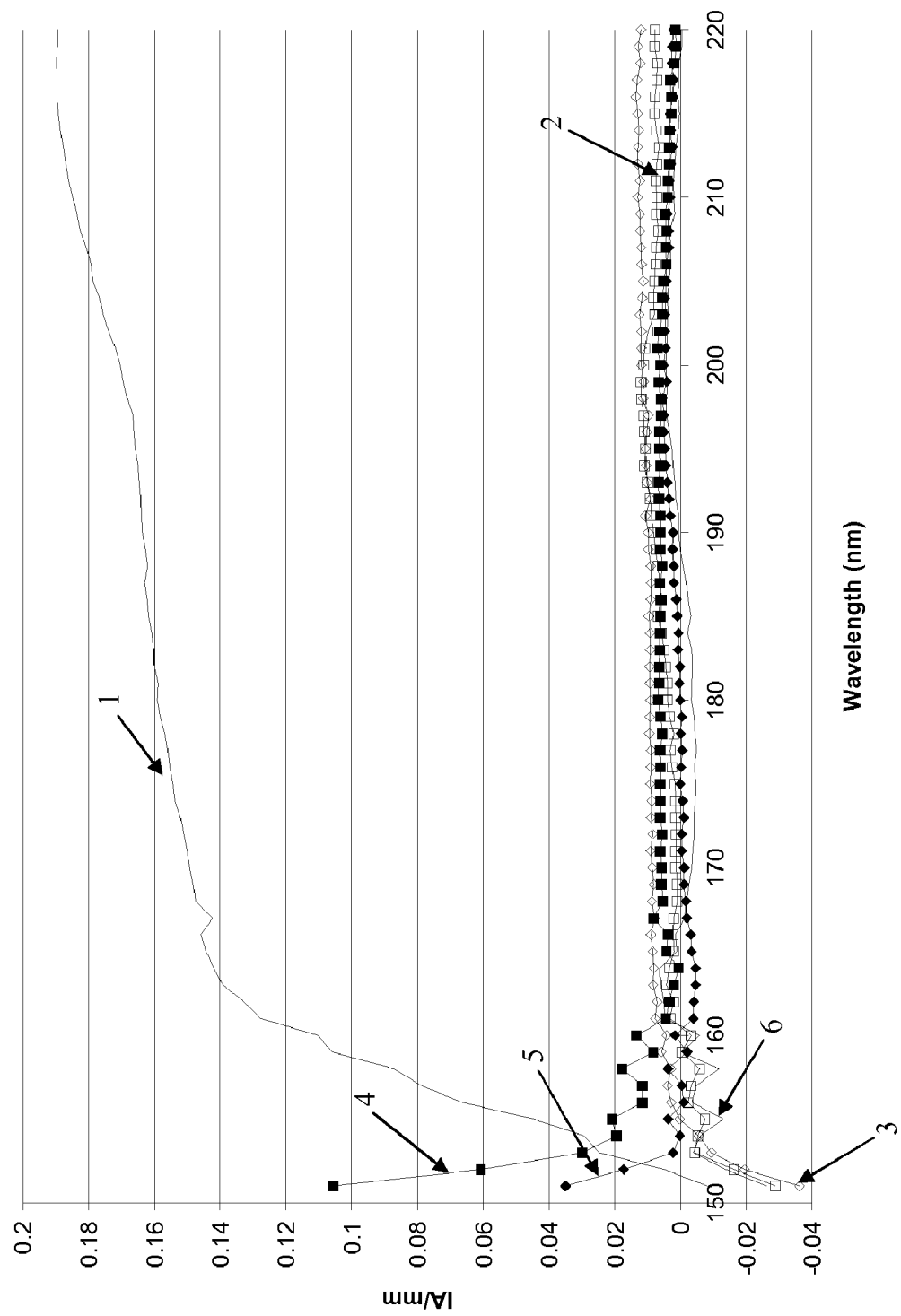
FIG. 10 is a plot of induced absorption (150-220 nm) spectra for CO-dried, halogen free, low OH, low OD fused silica glasses of the present invention, and a fluorine-dried, a fused silica glass having an OH concentration of about 100 ppm by weight that had not been dried using CO, and a fluorine-dried fused silica glass containing 5000 ppm F by weight.

FIG. 10 shows VUV-IA spectra (150-220 nm) for: 1) a fused silica sample that had not been dried with CO, not loaded with molecular hydrogen, and containing 99 ppm OH by weight; 2) a fused silica sample dried with CO, containing 1.8 ppm OH by weight, not loaded with molecular hydrogen; 3) a fused silica sample dried with CO, containing 3 ppm OD by weight, not loaded with molecular hydrogen; 4) a fused silica sample dried with CO, containing 1.8 ppm OH by weight, loaded with molecular hydrogen; 5) a fused silica sample dried with CO, containing 3 ppm OD by weight, loaded with molecular hydrogen; and 6) a fused silica sample, containing 5000 ppm fluorine by weight and no OH, that had not been dried with CO and not loaded with molecular hydrogen. The four CO-dried, halogen free, low OH, low OD fused silica glasses (samples 2-5) of the present invention were prepared according to the methods described herein. The spectra were taken after exposing the glasses to a 193 nm $F_2$ excimer laser with a fluence of 1.3 mJ·cm$^{-2}$·pulse$^{-1}$. Those glasses that had been loaded with $H_2$ (samples 4 and 5) were exposed to $9.5\times10^6$ pulses of the laser, whereas those glasses that were not loaded with $H_2$ (samples 2 and 3) were exposed to $5\times10^6$ pulses. The data show that the IA of the CO-dried, halogen-free low OH and low OD silica glasses of the present invention is very low at vacuum ultraviolet wavelengths and is comparable to that of the fluorine-dried, F-doped fused silica glass. The increase in IA at very short wavelengths (<160 nm) in the CO-dried fused silica glasses is attributed to the formation of a small amount of OH due to reaction of $H_2$ with the silica network during exposure. This indicates that for very short wavelength applications, such as at 157 nm, hydrogen-free glasses may be preferred. Alternatively, the glass, when used at such wavelengths, may be loaded with $D_2$, since the OD groups formed during irradiation by the $F_2$ excimer laser will have less absorption at these wavelengths than OH groups.

Figure 11:
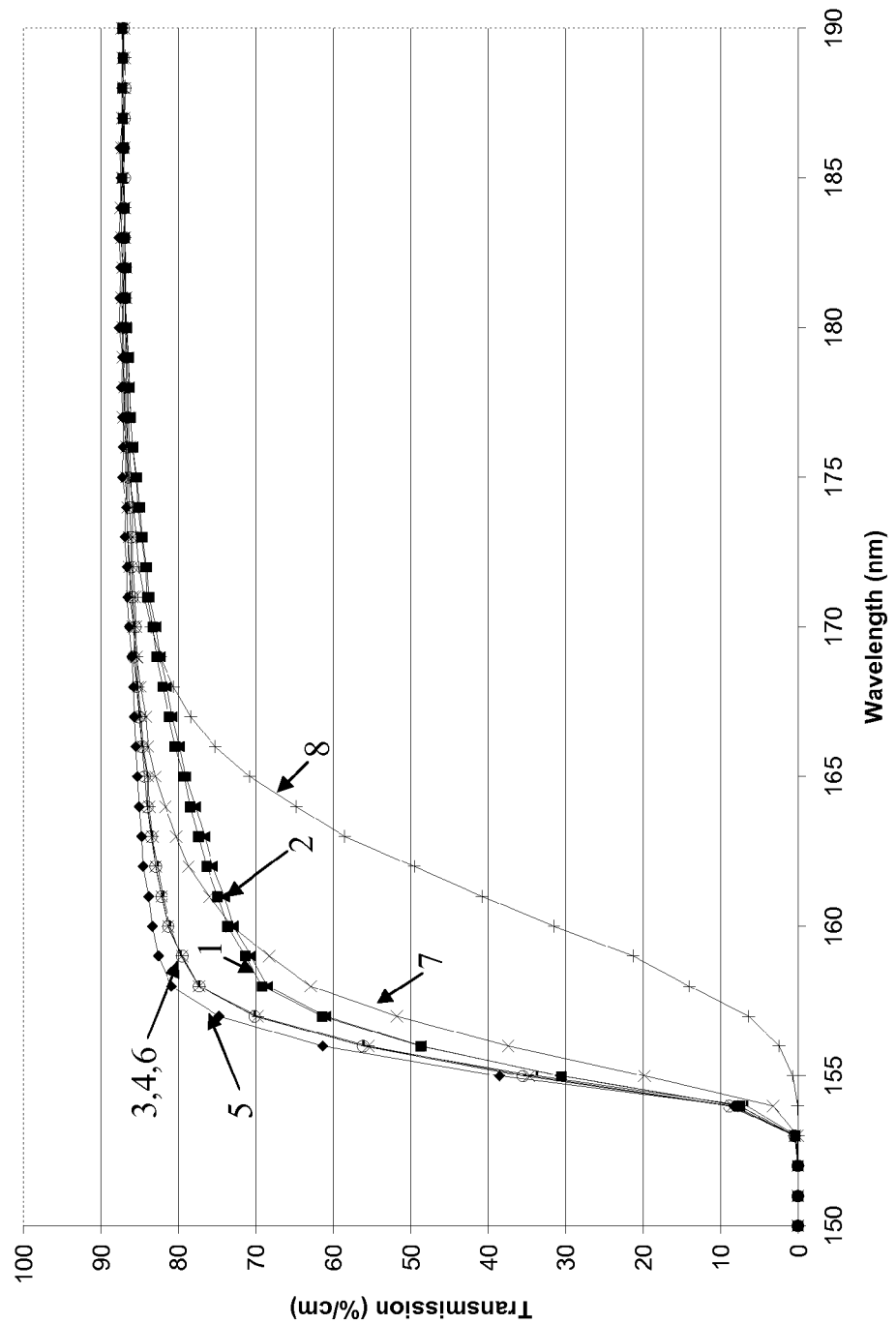
FIG. 11 is a plot of VUV transmission measurements for the CO-dried, halogen-free fused silica glasses of the present invention and fused silica glasses doped with either F or OH, and OD that had not been dried using CO.

FIG. 11 shows VUV transmission measurements that were obtained on 10 mm thick polished samples of: 1) a fused silica sample dried with CO, containing 1.77 ppm OD and 0.32 ppm OH by weight, not loaded with molecular hydrogen; 2) a fused silica sample dried with CO, containing 0.98 ppm OH (protium) by weight, not loaded with molecular hydrogen; 3) a fused silica sample dried with CO, containing 1.71 ppm OD and 0.98 ppm OH (protium) by weight, loaded with molecular hydrogen at 425° C.; 4) a fused silica sample dried with CO, containing 1.73 ppm OH by weight, loaded with molecular hydrogen at 425° C.; 5) a fused silica sample, containing 5000 ppm fluorine by weight and containing no OH, that had not been dried with CO and not loaded with molecular hydrogen, and; 6) a fused silica sample that had not been dried with CO and not loaded with molecular hydrogen, and containing 500 ppm fluorine and 0.8 ppm OH by weight; 7) a fused silica sample that had not been dried with CO and not loaded with molecular hydrogen, and containing 200 ppm fluorine and 11.5 ppm OH by weight; and 8) a fused silica sample that had not been dried with CO and not loaded with molecular hydrogen, and containing 82 ppm OH by weight. The CO-dried, halogen-free fused silica glasses (samples 1-4) of the present invention were prepared according to the methods described herein. For comparison, VUV transmission spectra for various F, and OH/OD doped fused silica glasses (samples 5-7) that were not CO-dried are also included in FIG. 11. The $H_2$ loaded, halogen-free CO-dried glasses (samples 3 and 4) exhibit high transmission and are comparable to F-doped silica glass having a similar level of OH. The CO-dried, low OD, and low OH glasses of the present invention and the dry F-doped silica glass (sample 5) each have an absorption edge (i.e., the wavelength at which the transmission is 50%/cm) that is below about 158 nm. Molecular hydrogen introduced during the $H_2$ loading process removes dissolved oxygen in the CO-dried glasses by reacting with $O_2$ to form a small amount of OH, thus eliminating absorption bands associated with excess oxygen and producing a halogen-free fused silica glass with a transmission spectrum that is comparable to a fluorine-doped silica glass having a similar level of OH. In those instances in which $H_2$ or $D_2$ loading of the fused silica glass is not desired, it may preferable to have some molecular $O_2$ in the glass to mitigate laser-induced formation of oxygen deficient ($\equiv$Si—Si$\equiv$) centers, also referred to as "ODCs," which have an absorption band at 163 nm. The amount of oxygen in the glass should, however, be kept low so as to not shift the UV edge to longer wavelengths.

While high VUV transmission and laser damage resistance can be realized in fluorine doped silica glasses, it is very difficult to achieve high index homogeneity in such glasses because fluorine has a very strong impact on refractive index. Small variations in fluorine concentration produce large index changes. Thus, the present invention provides a glass having very good VUV transmission, VUV laser damage resistance, and high index homogeneity.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A fused silica article, the fused silica article having an index homogeneity less than or equal to about 5 ppm in at least one direction through the fused silica article over an aperture area of at least about 50 cm$^2$, wherein the fused silica article has an absorption edge of less than or equal to 156 nm, and wherein the fused silica article is substantially free of fluorine, chlorine, and bromine.

2. The fused silica article according to claim 1, wherein the combined concentration of OH and OD groups is less than about 5 ppm by weight.

3. The fused silica article according to claim 2, wherein the combined concentration of OH and OD has a variation of less than or equal to 2 ppm by weight in a direction perpendicular to the optical path through the fused silica article over the aperture area.

4. The fused silica article according to claim 2, wherein the ratio of OD concentration to the combined concentration of OH groups and OD groups is greater than the natural isotopic abundance of deuterium.

5. The fused silica article according to claim 1, wherein the fused silica article is exposed to CO before consolidation at a temperature in a range from about 900° C. up to about 1400° C.

6. The fused silica article according to claim 1, wherein the fused silica article has a combined concentration of mixed molecular hydrogen species, molecular protium, and molecular deuterium is in a range from about 1×10$^{16}$ molecules/cm$^3$ up to about 1×10$^{17}$ molecules/cm$^3$.

7. The fused silica article according to claim 6, wherein molecular deuterium is present in an amount that is greater than the natural isotopic abundance of deuterium.

8. The fused silica article according to claim 1, wherein the index homogeneity is less than or equal to about 0.6 ppm in a direction that is perpendicular to the optical path through the fused silica article over an aperture area of at least about 50 cm$^2$.

9. The fused silica article according to claim 1, wherein the fused silica article exhibits a laser-induced wavefront distortion, measured at a wavelength of 633 nm, of less than about 3.0 nm/cm, when subjected to 5 billion pulses of a laser beam operating at about 193 nm, the laser beam having a fluence of about 500 μJ·cm$^{-2}$·pulse$^{-1}$, a pulse length of about 21 ns.

10. The fused silica article according to claim 1, wherein the fused silica article exhibits a polarization induced birefringence of less than about 1 nm/cm, when subjected to 5 billion pulses of a laser beam operating at about 193 nm, the laser beam having a fluence of about 500 μJ·cm$^{-2}$·pulse$^{-1}$, and a pulse length of about 21 ns.

11. The fused silica article according to claim 1, wherein the fused silica article has an internal transmission of at least 99.7%/cm at a wavelength of about 193 nm.

12. The fused silica article according to claim 1, wherein the fused silica article has an induced absorption of less than about 0.002 cm$^{-1}$ when exposed to 5×10$^9$ pulses of a laser beam operating at a wavelength of about 193 nm, the laser beam having a fluence of about 500 μJ·cm$^{-2}$·pulse$^{-1}$, and a pulse length of about 21 ns.

13. The fused silica article according to claim 12, wherein the fused silica article has an induced absorption of less than about 0.0003 cm$^{-1}$ when exposed to 5×10$^9$ pulses of a laser beam operating at a wavelength of about 193 nm, the laser beam having a fluence of about 500 μJ·cm$^{-2}$·pulse$^{-1}$, and a pulse length of about 21 ns.

14. The fused silica article according to claim 1, wherein the fused silica article has an initial birefringence of less than about 0.5 nm/cm over an area of at least 25 cm$^2$.

15. The fused silica article according to claim 1, wherein the fused silica article has an overall index homogeneity of less than about 1 ppm.

16. The fused silica article according to claim 1, wherein the fused silica article is substantially free of at least one of multiple striae and event striae in a plane perpendicular to the optical path.

17. The fused silica article according to claim 1, wherein the fused silica article is an optical element that forms a portion of a lithographic stepper/scanner system.

18. A fused silica article, the fused silica article having a refractive index change PV of less than about 0.05 ppm over a 1 cm$^2$ area within an aperture of the fused silica article, wherein the fused silica article is substantially free of fluorine, chlorine, and bromine, and wherein the fused silica article has an absorption edge of less than or equal to 156 nm.

19. The fused silica article according to claim 18, wherein the refractive index change PV is less than about 5% of the total index change PV$_{total}$ over a 1 cm$^2$ area within the aperture.

20. The fused silica article according to claim 18, wherein the index change PV is less than about 50% of a total index change PV$_{total}$ over a 25 cm$^2$ area within the aperture.

21. A method of making a fused silica article, the method comprising the steps of:
   a. providing a silica soot blank, the silica soot blank comprising at least one of OH and OD;
   b. drying the silica soot blank by exposing the fused silica soot blank to CO in a halogen free atmosphere to reduce a combined concentration of OH and OD in the fused silica soot blank below a predetermined level;
   c. exposing the dried fused silica soot blank to molecular oxygen, wherein the molecular oxygen converts CO into CO$_2$; and
   d. consolidating the dried silica soot blank to form the fused silica article, wherein the fused silica article exhibits an absorption edge of less than less than or equal to 156 nm, wherein the fused silica article is substantially free of fluorine, chlorine, and bromine.

22. The method according to claim 21, further comprising the step of loading the consolidated fused silica article with at least one of molecular protium and molecular deuterium.

23. The method according to claim 22, wherein molecular deuterium is present in an amount that is greater than the natural isotopic abundance of deuterium.

24. The method according to claim 22, wherein the fused silica article has a combined concentration of OH groups and OD groups of less than about 20 ppm by weight.

25. The method according to claim 24, wherein the combined concentration of OH and OD has a variation of less than or equal to 1 ppm by weight in a direction perpendicular to an optical path through the fused silica article.

26. The method according to claim 24, wherein the fused silica article has an optical index homogeneity less than or equal to about 5 ppm in a direction perpendicular to an optical path through the fused silica article.

27. The method according to claim 21, wherein the fused silica article has at least 99.7% transmission for radiation having a wavelength of 193 nm.

28. The method according to claim 21, wherein the fused silica article has a refractive index change PV of less than about 0.5 ppm over a 25 cm$^2$ area within an aperture of the fused silica article.

* * * * *

UNITED STATES PATENT AND TRADEMARK OFFICE
CERTIFICATE OF CORRECTION

PATENT NO. : 8,268,740 B2  
APPLICATION NO. : 12/364083  
DATED : September 18, 2012  
INVENTOR(S) : Richard Michael Fiacco et al.

Page 1 of 1

It is certified that error appears in the above-identified patent and that said Letters Patent is hereby corrected as shown below:

On the Title Page Item (75) should read:

(75) Inventors: Richard Michael Fiacco, Corning, NY (US); Kenneth Edward Hrdina, Horseheads, NY (US); Rostislav Radiyevich Khrapko, Corning, NY (US); Lisa Anne Moore, Corning, NY (US); Charlene Marie Smith, Corning, NY (US)

Signed and Sealed this

Thirteenth Day of November, 2012

David J. Kappos
*Director of the United States Patent and Trademark Office*